United States Patent
Lee et al.

(10) Patent No.: US 9,773,645 B2
(45) Date of Patent: Sep. 26, 2017

(54) REMOTE PLASMA GENERATOR USING CERAMIC

(71) Applicant: SAMSUNG ELECTRONICS CO., LTD., Suwon-si, Gyeonggi-do (KR)

(72) Inventors: Ja-woo Lee, Hwaseong-si (KR); Chung-huan Jeon, Seoul (KR); Heok-jae Lee, Suwon-si (KR); Jang-hyoun Youm, Suwon-si (KR); Sang-jean Jeon, Suwon-si (KR); Kwang-young Jung, Hwaseong-si (KR); Sun-uk Kim, Daejeon (KR); Kang-ho Lee, Daejeon (KR); Jung-hyun Cho, Yongin-si (KR); Soon-im Wi, Suwon-si (KR); Yun-sik Yang, Suwon-si (KR); Moo-jin Kim, Seoul (KR); Jang-kyu Choi, Suwon-si (KR)

(73) Assignees: SAMSUNG ELECTRONICS CO., LTD., Suwon-si, Gyeonggi-do (KR); DANDAN CO., LTD., Yuseong-gu, Daejeon (KR); NEW POWER PLASMA CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/010,151

(22) Filed: Jan. 29, 2016

(65) Prior Publication Data
US 2016/0307739 A1 Oct. 20, 2016

(30) Foreign Application Priority Data
Apr. 14, 2015 (KR) .................. 10-2015-0052460

(51) Int. Cl.
H01J 37/32 (2006.01)
H05H 1/46 (2006.01)
H05H 1/24 (2006.01)

(52) U.S. Cl.
CPC ...... H01J 37/32467 (2013.01); H01J 37/321 (2013.01); H01J 37/3266 (2013.01);
(Continued)

(58) Field of Classification Search
CPC .......... H01J 37/32467; H01J 37/32082; H01J 37/32495
(Continued)

(56) References Cited

U.S. PATENT DOCUMENTS 4,473,736 A * 9/1984 Bloyet .................. H05H 1/46
219/121.36
6,776,873 B1 8/2004 Sun et al.
(Continued)

FOREIGN PATENT DOCUMENTS

JP 2001-244251 A 9/2001
KR 10-2007-0031168 A 3/2007
(Continued)

Primary Examiner — Dylan White
(74) Attorney, Agent, or Firm — Lee & Morse

(57) ABSTRACT

A remote plasma generator includes a body, a driver, and a protection tube. The body includes a gas injection port, a plasma exhaust port, and a plasma generation pipe through which discharge gas or plasma flow. The driver is coupled to the body and generates a magnetic field and plasma in the body. The protection tube is at an inner side of the plasma generation pipe to protect the plasma generation pipe from plasma.

16 Claims, 10 Drawing Sheets

(52) U.S. Cl.
CPC .. *H01J 37/32357* (2013.01); *H01J 37/32477* (2013.01); *H01J 37/32495* (2013.01); *H05H 1/2406* (2013.01); *H05H 1/46* (2013.01); *H05H 2001/2462* (2013.01); *H05H 2001/4667* (2013.01); *H05H 2001/4682* (2013.01)

(58) Field of Classification Search
USPC .................................................. 315/111.41
See application file for complete search history.

(56) References Cited

U.S. PATENT DOCUMENTS

| | | | | |
|---|---|---|---|---|
| 7,220,497 | B2 * | 5/2007 | Chang ................... | C04B 41/009 118/723 R |
| 7,311,797 | B2 * | 12/2007 | O'Donnell .......... | C23C 16/4404 118/724 |
| 8,097,105 | B2 * | 1/2012 | Shih ........................ | H01J 9/24 156/89.11 |
| RE45,527 | E * | 5/2015 | Choi ........................ | 156/345.48 |
| 2002/0009560 | A1 * | 1/2002 | Ozono ..................... | B32B 1/02 428/34.4 |
| 2002/0086118 | A1 * | 7/2002 | Chang ..................... | C23C 4/00 427/447 |
| 2009/0302002 | A1 | 12/2009 | Collins et al. | |

FOREIGN PATENT DOCUMENTS

| | | |
|---|---|---|
| KR | 10-2008-0068974 A | 7/2008 |
| KR | 10-2010-0078001 A | 7/2010 |
| KR | 101254574 B1 * | 4/2013 |

\* cited by examiner

REMOTE PLASMA GENERATOR USING CERAMIC

CROSS-REFERENCE TO RELATED APPLICATION

Korean Patent Application No. 10-2015-0052460, filed on Apr. 14, 2015, and entitled, "Remote Plasma Generator Capable of Reducing Particles by Using Ceramic," is incorporated by reference herein in its entirety.

BACKGROUND

1. Field

One or more embodiments described herein relate to a remote plasma generator using ceramic.

2. Description of the Related Art

A remote plasma generator generates plasma outside of a process chamber for use by a semiconductor process performed in the process chamber. Attempts have been made to improve the corrosion resistance, abrasion resistance, and heat resistance of the generator using an aluminum anodizing coating layer. However, particles may be produced by the aluminum anodizing coating layer during the process. The particles may contaminate the process and cause the remote plasma generator to malfunction.

SUMMARY

In accordance with one or more embodiments, a remote plasma generator includes a body including a gas injection port, a plasma exhaust port, and a plasma generation pipe through which discharge gas or plasma flow; a driver, coupled to the body, to generate a magnetic field and plasma in the body; and a protection tube, at an inner side of the plasma generation pipe, to protect the plasma generation pipe from plasma. The generator may include a protection layer at a portion of an inner side of the body except for the inner side of the plasma generation pipe. The protection layer may include a coating layer having plasma corrosion resistance. The protection tube may include yttrium oxide.

A tolerance between the protection tube and the plasma generation pipe may be about 0.1 mm to about 10 mm. The generator may include an adhesive layer between the plasma generation pipe and protection tube. The protection tube may include a first bent portion extending from at least one of two end portions of the protection tube in a first direction and covering an end of the adhesive layer; and a second bent portion extending in a second direction crossing the first direction of the first bent portion.

The protection tube may include a first bent portion extending from at least one of two end portions of the protection tube in a first direction and covering an end of the adhesive layer; and a protection ring at an end of the first bent portion. The generator may include a protection ring at least one of two end portions of the protection tube and covering an end of the adhesive layer, and the protection ring may have an outer circumference with a stepped portion and extends in a direction crossing a main surface thereof. The adhesive layer may include a silicone adhesive.

The generator may include a cooling channel formed in the body to circulate a cooling medium, and the cooling channel may have a first side connected to a cooling medium supply source and a second side connected to a cooling medium recovery device. The generator may include a temperature sensor to measure a temperature of the protection tube; and a controller to receive a temperature signal from the temperature sensor and apply control signals to the cooling medium supply source and cooling medium recovery device.

In accordance with one or more other embodiments, a remote plasma generator includes a body including a gas injection port and a plasma exhaust port; a driver electrode, fixed to the body, to receive an alternating-current (AC) voltage and to generate plasma in the body; a ground electrode fixed to the body and interposed between the driver electrode and the plasma exhaust port; and a protection layer to protect an inners side of the body from plasma. The protection layer may include yttrium oxide. The generator may include an adhesive layer between the body and the protection layer.

In accordance with one or more other embodiments, an apparatus for a plasma generator includes a pipe to transfer gas or plasma; and a protection layer on an inner surface the pipe, wherein the protection layer separates the inner surface of the pipe from the gas or plasma and includes a first portion extending in a first direction substantially parallel to the inner surface of the pipe and a second portion crossing the first direction, the second portion overlapping an end of the pipe and an end of a body adjacent to the end of the pipe, the protection layer including a material resistant to corrosion from the gas or plasma. The material may include yttrium oxide.

The apparatus may include a third portion contacting the second portion of the protection layer, wherein the third portion extends from the end of the second portion of the protection layer in the first direction. The third portion may be integrally formed with the second portion. The third portion may be a ring contacting the second portion of the protection layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
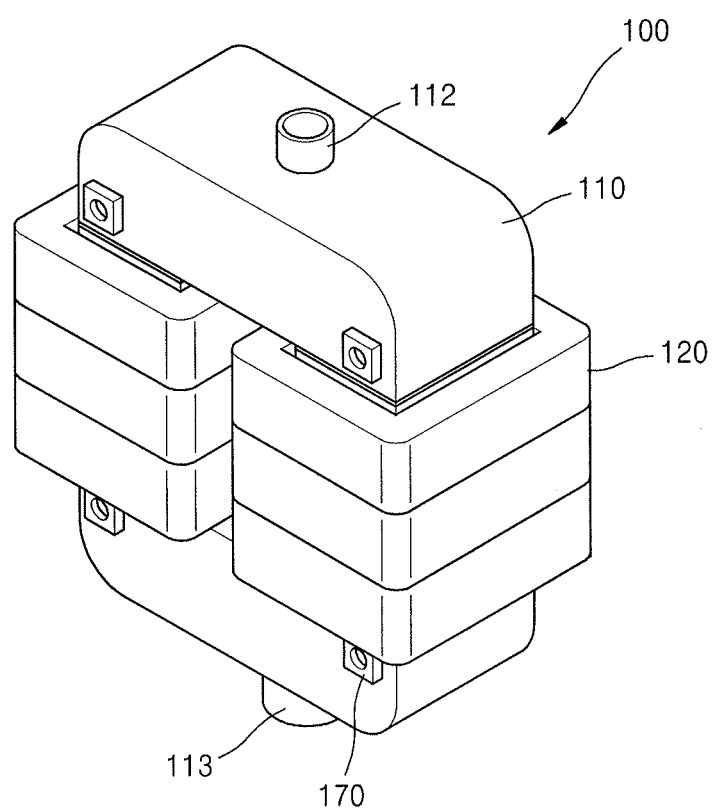
FIG. 1 illustrates an embodiment of a remote plasma generator.

Example embodiments are described hereinafter with reference to the drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 2:
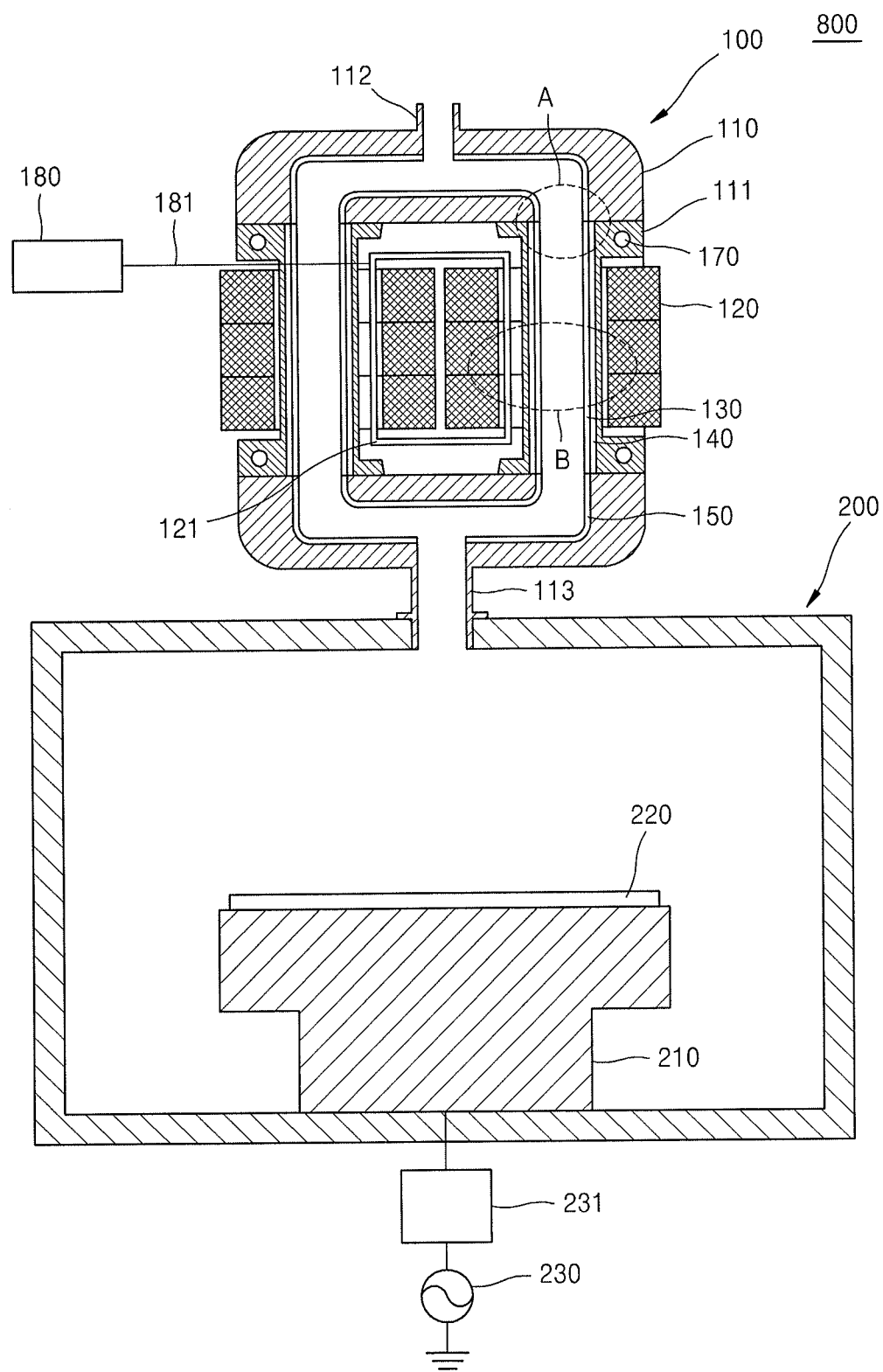
FIG. 2 illustrates an embodiment of a substrate processing apparatus.

FIG. 1 illustrates an embodiment of a remote plasma generator 100, and FIG. 2 is a cross-sectional view of an embodiment of a substrate processing apparatus 800 including the remote plasma generator 100 and a process chamber 200.

Referring to FIGS. 1 and 2, the remote plasma generator 100 includes a body unit 110, a driver unit 120, a protection tube 130, an adhesive member 140, and a protection member 150.

The body unit 110 has one side that includes a gas injection port 112 and another side that includes a plasma exhaust port 113. The gas injection port 112 receives discharge gas from a gas supply unit, and the plasma exhaust port 113 exhausts plasma to the process chamber 200. The body unit 110 may include a plasma generation pipe 111 between the gas injection port 112 and the plasma exhaust port 113. In one embodiment, the plasma generation pipe 111 refers to a portion of the body unit 110 that includes a path through which the discharge gas or plasma is transmitted. A vertically cut section of the path may have one of various sectional shapes, e.g., circular shape, square shape, or elliptical shape. Furthermore, the body unit 110 may include an ignition electrode for causing ignition during plasma discharge.

The driver unit 120 may be mounted on the body unit 110 and may include a magnetic core formed of a ferrite material, iron (Fe), or air. In one embodiment, the driver unit 120 may be a magnetic core fixed to the plasma generation pipe 111. The driver unit 120 may include a primary coil 121 and electrically connected to a power source unit 180 through a radio frequency cable 181. The body unit 110 may receive the discharge gas from the gas supply unit and may receive a radio frequency signal from the power source unit 180. When current is supplied to the primary coil 121, induced electromagnetic force is transmitted to the inside of the body unit 110. The discharge gas is excited by an induced electric field in the body unit 110 to generate plasma.

The discharge gas injected into the body unit 110 may be an inert gas (e.g., helium (He), neon (Ne), argon (Ar), and nitrogen ($N_2$)) or a mixture of an inert gas and clean dry air.

A reactive gas or process gas may be added to the discharge gas. The reactive gas or process gas may be selected, for example, to perform one or more functions, e.g., cleaning, etching, atomic layer deposition (ALD), surface processing, or material decomposition. The reactive gas or process gas may include, for example, $SF_6$, $CH_4$, $CF_4$, $O_2$, or $NF_3$ and may include a liquid precursor such as but not limited to tetra-ethyl-ortho-silicate (TEOS), tetrakis((ethyl-methylamino)zirconium)), trimethyl aluminum, or hexamethyldisiloxane.

The protection tube 130 may prevent an inner wall of the plasma generation pipe 111 from being etched due to plasma. The protection tube 130 may be manufactured in bulk by using a plasma corrosion resistance material, and added on an inner side of the plasma generation pipe 111 and mounted in the plasma generation pipe 111.

Although a coating layer having plasma corrosion resistance may be formed on the inner side of the plasma generation pipe 111, it may be difficult to effectively perform a coating operation on the inner side of the plasma generation pipe 111 due to a shape of the plasma generation pipe 111 and a size of a coating nozzle. Thus, it may be effective to manufacture the protection tube 130 in bulk by using a plasma corrosion resistance material.

The protection tube 130 for protecting the remote plasma generator 100 may be formed by selecting a plasma corrosion resistance material. The plasma corrosion resistance material may include, for example, a metal material (e.g., aluminum (Al), titanium (Ti), palladium (Pa), zirconium (Zr), hafnium (Hf), niobium (Nb), or yttrium (Y)), an alloy of the metal material, a ceramic material, or a combination thereof.

In one embodiment, the protection tube 130 may be manufactured using yttrium oxide ($Y_2O_3$) that is a ceramic material. Although an anodizing coating layer has been used to prevent damage to the inside of a semiconductor device, particles generated when the anodizing coating layer is etched due to plasma may act as a contamination source in the semiconductor device and cause malfunctions in the semiconductor device.

In contrast, since yttrium oxide has a higher plasma corrosion resistance than the anodizing coating layer, yttrium oxide may prevent the inside of the body unit 110 from being exposed to plasma and damaged, and may also reduce generation of particles due to the etching of a wall surface of the body unit 110 or a coating layer for protecting the body unit 110. Therefore, yttrium oxide may reduce defects in the semiconductor device due to the particles.

In addition, when the protection tube 130 is manufactured in bulk using yttrium oxide as a material, the protection tube 130 may have a higher plasma corrosion resistance than when a yttrium oxide coating layer is used. However, when the protection tube 130 is manufactured in bulk using yttrium oxide, the protection tube 130 may have weak mechanical properties and may be deformed or damaged due to stress or heat. Thus, a tolerance between the plasma generation pipe 111 and the protection tube 130 may have to be managed or the adhesive member 140 may be interposed between the plasma generation pipe 111 and protection tube 130.

In an embodiment, the protection tube 130 and the plasma generation pipe 111 may be mounted with a tolerance of about 0.1 mm to about 10 mm therebetween, without using the adhesive member 140. Where the protection tube 130 is manufactured in bulk using a material such as yttrium oxide, which has weak mechanical properties and is easily deformed or damaged due to stress or heat, the protection tube 130 may be thermally deformed and broken when the tolerance is excessively small. Also, heat may not be efficiently transmitted when the tolerance is excessively large. Thus, an appropriate tolerance may be provided.

In one embodiment, the protection tube 130 may have a thickness of about 1.7 mm or less. When the protection tube 130 is manufactured using a material having a low thermal shock resistance, the difference in temperature inside and outside of the protection tube 130 may increase when the protection tube 130 has a large thickness, e.g., above a predetermined value. Thus, the protection tube 130 may be damaged.

In one embodiment, the protection member 150 formed of a plasma corrosion resistance material may be formed on the remaining portion of the inner side of the body unit 110, except for the inner side of the plasma generation pipe 111 on which the protection tube 130 is mounted. The protection member 150 may include a coating layer formed of a plasma corrosion resistance material or manufactured in bulk using a plasma corrosion resistance material. Also, in an embodiment, an ignition electrode may be formed in an upper portion of the body unit 110. Because a lot of particles are generated around the ignition electrode, a cover unit, including a member formed of a plasma corrosion resistance material, may surround the ignition electrode in order to reduce the generation of the particles.

The coating layer inside the body unit 110 may be formed of a plasma corrosion resistance material using, for example, a plasma spray coating technique, a sputtering process, a beam evaporation process, or a chemical vapor deposition process.

When the protection member 150 is manufactured in bulk using a plasma corrosion resistance material, the protection member 150 may be added on the inner side of the body unit 110 and mounted on the body unit 110. Based on the shape of the inner side of the body unit 110, the protection member 150 may be manufactured in bulk on a portion that is hard to coat because of the size of the coating nozzle. Thus, the protection member 150 may be mounted on the portion that is hard to coat and effectively protect the body unit 110.

The adhesive member 140 may be provided between the protection tube 130 and the plasma generation pipe 111 to improve mechanical connection therebetween. The adhesive member 140 may be, for example, a silicone adhesive. The adhesive member 140 may function as a heating medium. When the protection tube 130 is formed of a material having a low thermal shock resistance, the adhesive member 140 may effectively prevent the protection tube 130 from being thermally deformed and broken. High-temperature heat generated in the body unit 110 may be externally transmitted through the protection tube 130, the adhesive member 140, and the body unit 110 and cooled off by the cooling channel 170 disposed inside or outside the body unit 110.

Figure 3:
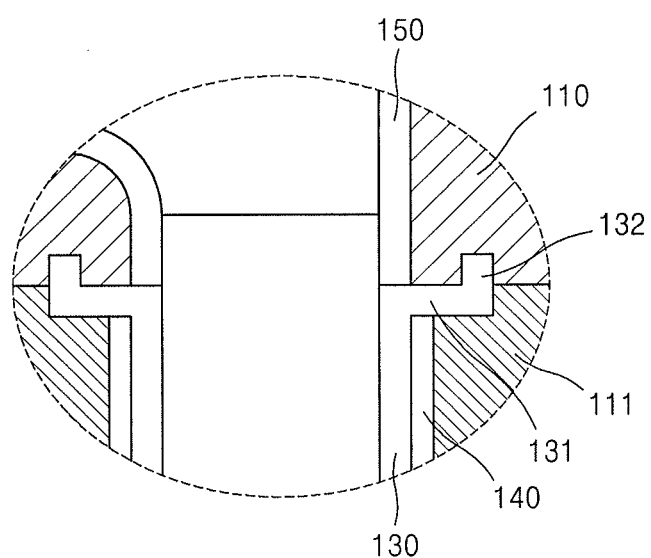
FIGS. 3 to 5 illustrate embodiments of region A in FIG. 2.
Figure 4:
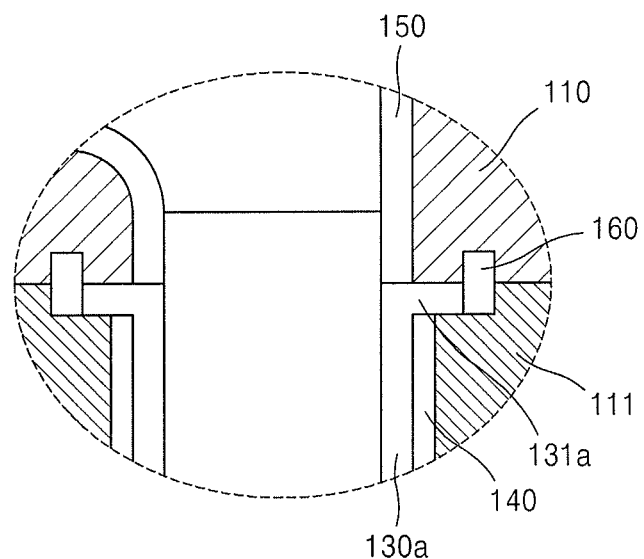
Figure 5:
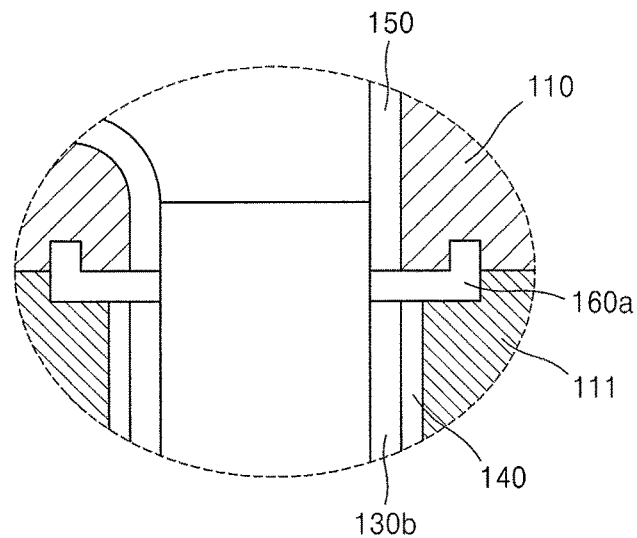

FIGS. 3 to 5 are enlarged cross-sectional views of various embodiments of region A in FIG. 2, which corresponds to a plasma inlet prevention structure for preventing the adhesive member 140 from being etched due to plasma.

Referring to FIG. 3, the protection tube 130 may include a first bent portion 131 and a second bent portion 132 to prevent plasma from being supplied to and damaging the adhesive member 140. The first bent portion 131 extends from at least one of two end portions of the protection tube 130 in a first direction and may cover an end of the adhesive member 140. The second bent portion 132 extends from an end portion of the first bent portion 131 in a second direction crossing the first direction. The protection tube 130 including the first bent portion 131 and the second bent portion 132, therefore, forms a stepped structure in at least one of the two end portions thereof and covers the adhesive member 140. As a result, plasma may be prevented from flowing into and damaging the adhesive member 140.

Referring to FIG. 4, plasma may be prevented from flowing into the adhesive member 140 using a protection ring 160. The protection ring 160 may be manufactured, for example, from a ceramic material or yttrium oxide ($Y_2O_3$). In one embodiment, the protection ring 160 may be formed of a plasma corrosion resistance material as described above. The protection tube 130a may include a first bent portion 131a which extends from at least one of two end portions of the protection tube 130a in a direction to cover an end of the adhesive member 140. The protection ring 160 may be disposed in an end portion of the first bent portion 131a. The protection tube 130a may be combined with the protection ring 160 to form a stepped structure to prevent plasma from flowing into the adhesive member 140.

Referring to FIG. 5, a protection ring 160a may be disposed in at least one of two end portions of the protection tube 130b. The protection ring 160a may include a stepped portion formed at an outer circumference of the protection ring 160a and extending in a direction perpendicular to a main surface of the protection ring 160a. The protection ring 160a may cover an end of the adhesive member 140. The protection tube 130b may be combined with the protection ring 160a to form a stepped structure to prevent plasma from flowing into the adhesive member 140.

Figure 6:
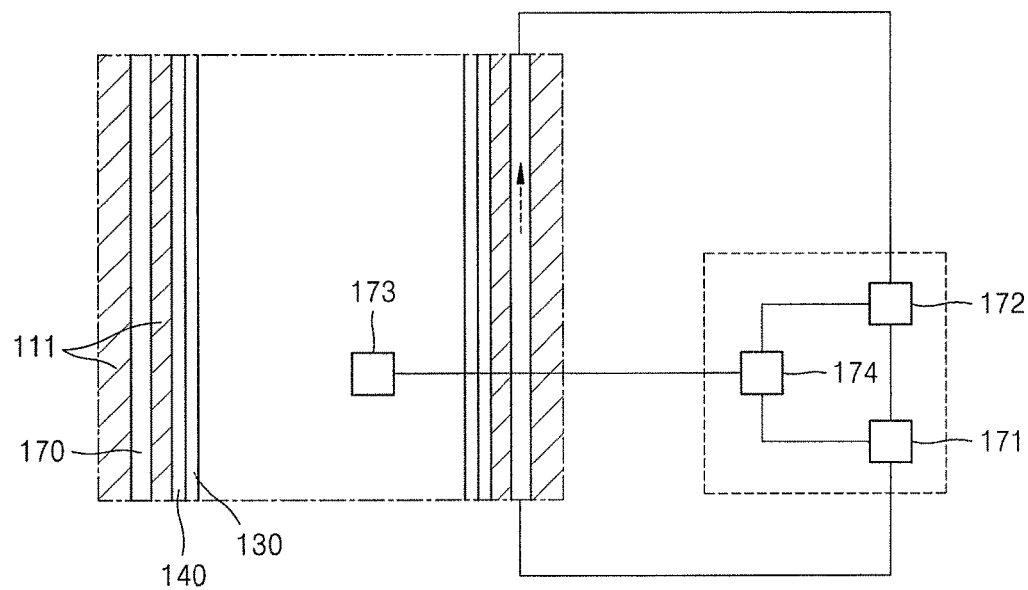
FIG. 6 illustrates an embodiment of region B in FIG. 2.
Figure 7:
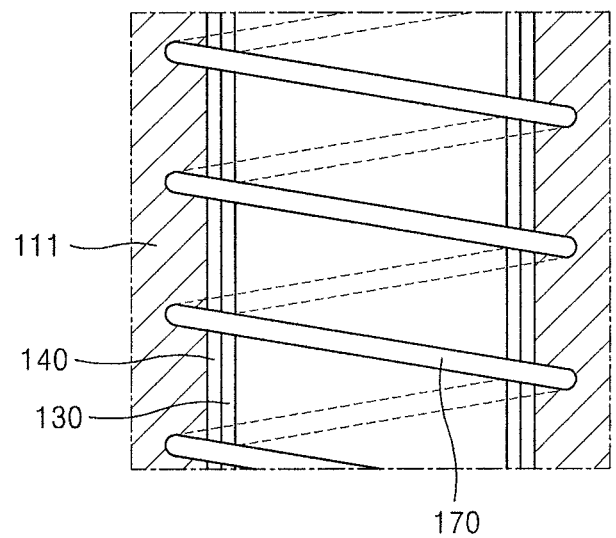
FIG. 7 illustrates another embodiment of region B.

FIGS. 6 and 7 are enlarged cross-sectional views of embodiments of region B in FIG. 2, which corresponds to a cooling channel to cool a remote plasma generator.

FIG. 6 illustrates a case in which the body unit 110 includes the cooling channel 170 between the plasma generation pipe 111 and the driver unit 120. While circulating through the cooling channel 170, a cooling medium may cool off the body unit 110 and the protection tube 130 and thus may prevent thermal deformation of the body unit 110 and the protection tube 130 from high temperatures. The cooling channel 170 may have one side connected to a cooling medium supply unit 171 and another side connected to a cooling medium recovery unit 172. The cooling channel 170 may include a single channel or a plurality of channels, and may be configured to circulate around the plasma generation pipe 111. Thus, the cooling channel 170 may be a conduit formed through the plasma generation pipe 111. T cross-section of the cooling channel 170 may not serve as a conduit in another embodiment.

The cooling medium supply unit 171 and the cooling medium recovery unit 172 may be connected to a controller 174. The controller 174 may receive a temperature signal from a temperature sensor 173 that measures the temperature of the protection tube 130. The controller 170 may then apply control signals to the cooling medium supply unit 171 and the cooling medium recovery unit 172 and control a flow rate of a cooling medium, which circulates in cooling channel 170, in response to control signals.

Referring to FIG. 7, the cooling channel 170 may be, for example, a spiral-type channel inside the plasma generation pipe 111. This structure may increase the area of heat exchange to thereby improve transmission of heat.

Referring back to FIG. 2, the substrate processing apparatus 800 includes the remote plasma generator 100 and the process chamber 200. The process chamber 200 receives plasma through the plasma exhaust port 113 of the remote plasma generator 100. A substrate support 210 for supporting a substrate 220 to be processed may be provided in the process chamber 200 and electrically connected to a bias power source 230 through an impedance matching device 231. At least one bias power source 230 may be electrically connected to the substrate support 210 through the impedance matching device 231. The substrate processing apparatus 900 may be used in various processes, e.g., a cleaning process, ALD process, surface processing process, or etching process.

Figure 8:
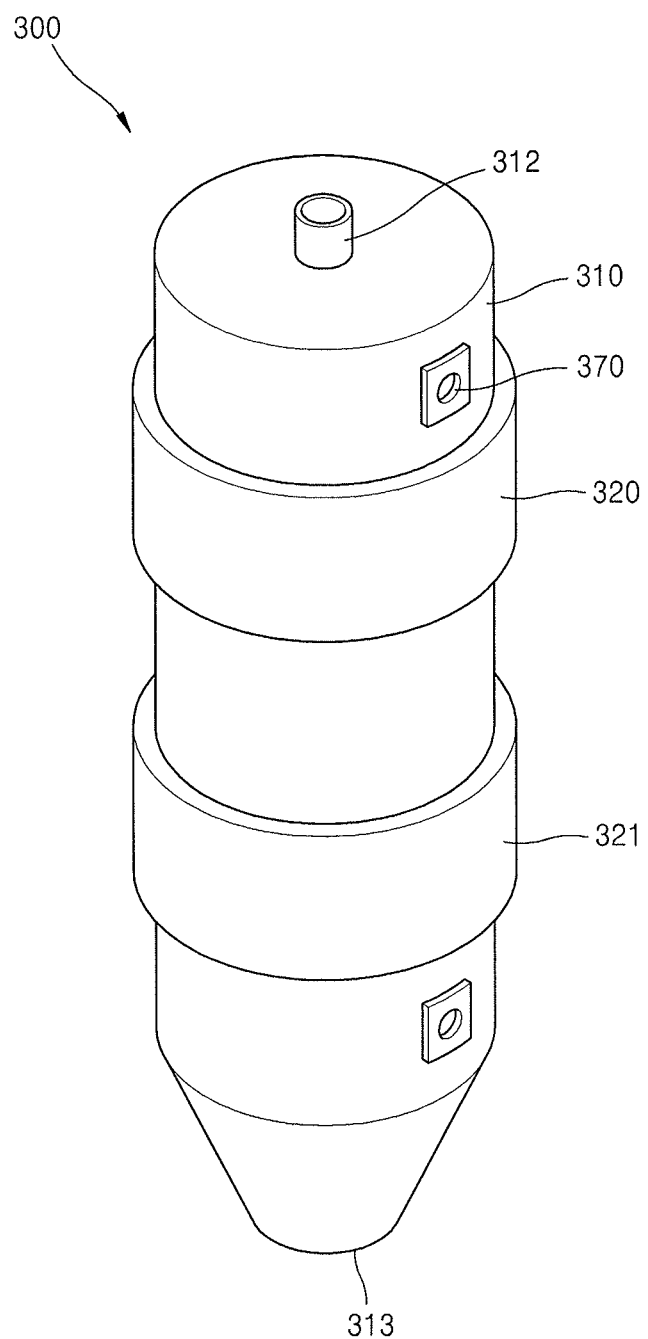
FIG. 8 illustrates another embodiment of a remote plasma generator.
Figure 9:
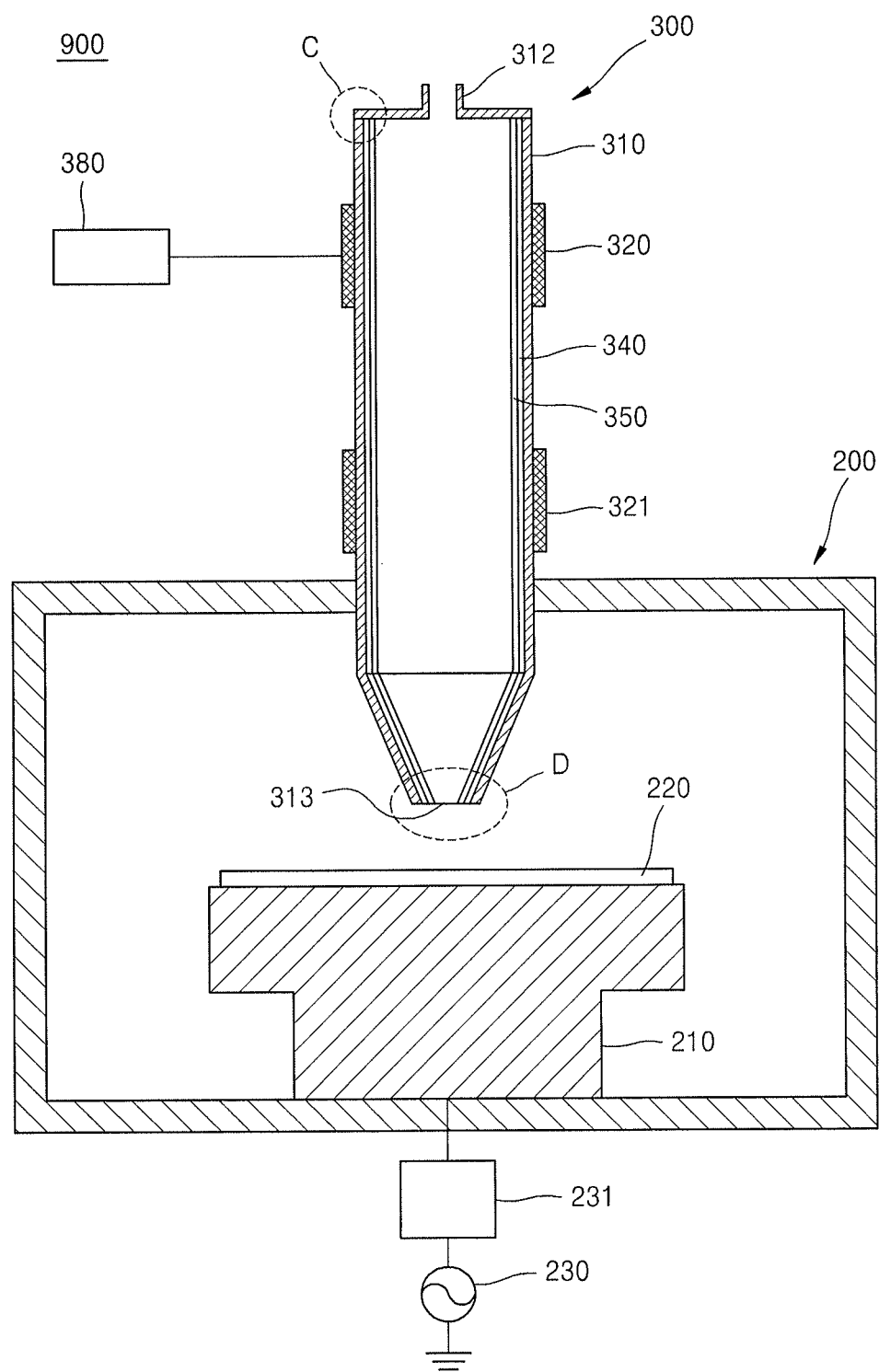
FIG. 9 illustrates another embodiment of a substrate processing apparatus.

FIG. 8 is a perspective view of another embodiment of a remote plasma generator 300, and FIG. 9 is a cross-sectional view of the substrate processing apparatus 900 including the remote plasma generator 300 and a process chamber 200. The process chamber of FIG. 9 may have the same configuration as the process chamber 200 of FIG. 2, except for portions of the remote plasma generator 100.

Referring to FIGS. 8 and 9, the remote plasma generator 300 includes a body unit 310, a driver electrode 320, a ground electrode 321, a protection member 350, an adhesive member 340, and a cooling channel 370.

The body unit 310 has one side that includes a gas injection port 312 and another side that includes a plasma exhaust port 313. The gas injection port 312 may receive discharge gas from a gas supply unit. A plasma exhaust port 313 may exhaust plasma to the process chamber 200. In FIG. 8, the body unit 310 has a cylindrical shape. In another embodiment, the body unit 310 may have another shape, e.g., a square shape or an elliptical shape. Also, the body unit 310 may include an ignition electrode for causing ignition during plasma discharge.

The driver electrode 320 may be fixed to the body unit 310. In FIG. 8, the driver electrode 320 surrounds the body unit 310. In one embodiment, the driver electrode 320 may include a plurality of electrodes spaced apart from one another on a side surface of the body unit 310. The driver electrode 320 may be electrically connected to a power source unit 380 and may receive an alternating current (AC) voltage for generating plasma from the power source unit 380. For example, the AC voltage applied to the driver electrode 320 may be a voltage of several hundred V or higher and may have a frequency of several tens of kHz to several tens of MHz.

The ground electrode 321 may be fixed to the body unit 310 and interposed between the driver electrode 320 and the plasma exhaust port 313. In FIG. 8, the ground electrode 321 surrounds the body unit 310. In one embodiment, the ground electrode 321 may include a plurality of electrodes spaced apart from one another on a side surface of the body unit 310.

When the driver electrode 320 receives an AC voltage from the power source unit 380, an electric field is formed in the body unit 310 based on a difference in electric potential between the driver electrode 320 and the ground electrode 321. Thus, plasma discharge may occur due to the discharge gas supplied through gas injection port 312.

The protection member 350 may be on an inner side of the body unit 310 to prevent the body unit 310 from being damaged due to plasma. The protection member 350 may include a coating layer of a plasma corrosion resistance material on an inner side of the body unit 350. In another embodiment, the protection member 350 may be manufactured in bulk using a plasma corrosion resistance material and may be mounted on the inner side of the body unit 310. In one embodiment, the protection member 350 may include a coating layer of yttrium oxide ($Y_2O_3$) or may be manufactured in bulk using yttrium oxide. In addition to yttrium oxide, the protection member 350 may be formed by using, for example, a metal material (e.g., aluminum (Al), titanium (Ti), palladium (Pa), zirconium (Zr), hafnium (Hf), niobium (Nb), or yttrium (Y)), an alloy of the metal material, a ceramic material, or a combination thereof.

The adhesive member 340 may be between the protection member 350 and the body unit 310 to improve mechanical connection therebetween. The adhesive member 340 may be, for example, a silicone adhesive. The adhesive member 340 may function as a heating medium. When the protection member 350 is formed of a material having a low thermal shock resistance, the adhesive member 340 may effectively prevent the protection member 350 from being thermally deformed and broken. High-temperature heat generated in the body unit 310 may be externally transmitted through the protection member 350, the adhesive member 340, and the body unit 310 and cooled off by the cooling channel 370 inside or outside the body unit 310.

The remote plasma generator 300 may include the cooling channel 370. The cooling channel 370 may include a single channel or a plurality of channels inside or outside the body unit 310. The cooling channel 370 may be, for example, a straight conduit or a spiral conduit. As described above with reference to FIGS. 6 and 7, a controller may receive a temperature signal from a sensor for measuring the temperature of the protection member 350. The sensor applies a control signal to a cooling medium supply unit and a cooling medium recovery unit, in order to control the flow rate of a cooling medium that circulates in the cooling channel 370.

Figure 10:
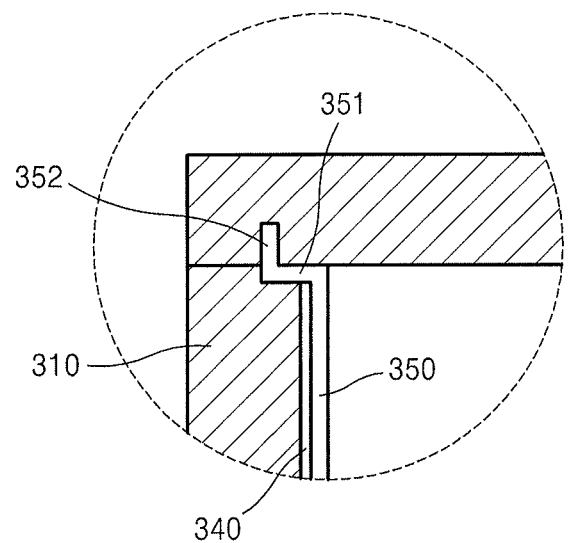
FIGS. 10 to 12 illustrate embodiments of region C in FIG. 9.
Figure 11:
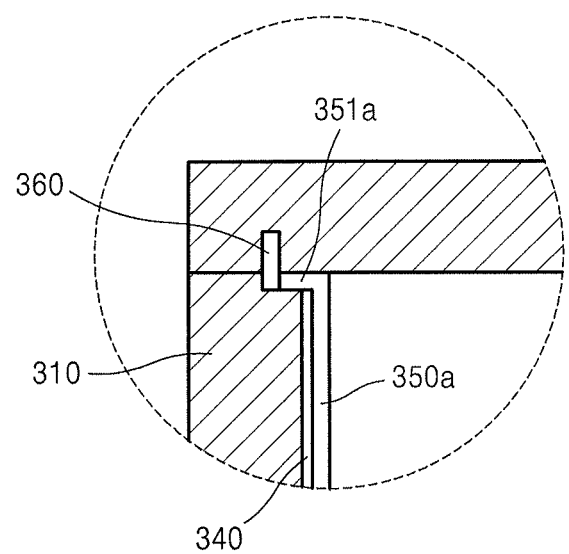
Figure 12:
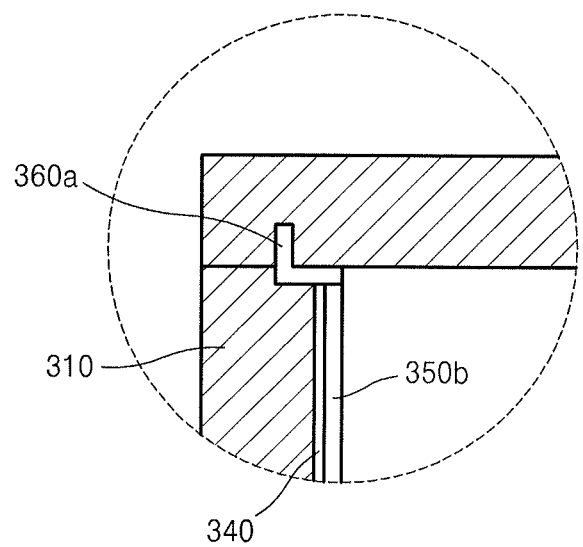
Figure 13:
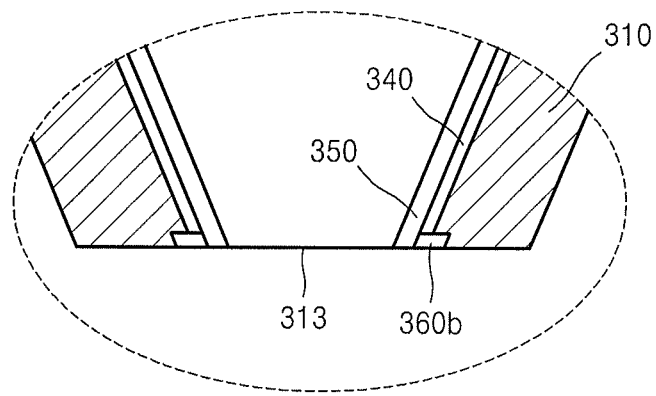
FIG. 13 illustrates an embodiment of region D in FIG. 9.

FIGS. 10 to 13 illustrate embodiments of a plasma inlet prevention structure for preventing the adhesive member 340 from being etched due to plasma. FIGS. 10 to 12 are enlarged cross-sectional views of embodiments of region C in FIG. 9, and FIG. 13 is an enlarged cross-sectional view of an embodiment of region D of FIG. 9.

Referring to FIG. 10, to prevent plasma from flowing into the adhesive member 340, the protection member 350 includes a first bent portion 351 and a second bent portion 352. The first bent portion 351 extends from an end portion of the protection member 350 in a first direction and covers an end of the adhesive member 340. The second bent portion 352 extends from an end portion of the first direction of the first bent portion 351 in a second direction crossing the first direction. The protection member 350 including the first bent portion 351 and the second bent portion 352 forms a stepped structure that covers the adhesive member 340. This structure may prevent plasma from flowing into the adhesive member 340.

Referring to FIG. 11, plasma may be prevented from flowing into the adhesive member 340 using a protection ring 360. A protection member 350a includes a first bent portion 351a that extends from an end portion of the protection member 350a in a direction and covers an end of the adhesive member 340. The protection ring 360 may be at an end portion of the first bent portion 351a. The protection member 350 may be combined with the protection ring 360 to form a stepped structure that covers the adhesive member 340. Thus, plasma may be prevented from flowing into the adhesive member 340.

Referring to FIG. 12, a protection ring 360a is at an end portion of the protection member 350 and contacts an end of the adhesive member 340. The protection ring 360a includes a stepped portion at an outer circumference of the protection ring 360a and extends in a direction crossing a main surface of the protection ring 360s. The protection member 350b may be combined with the protection ring 360a to form a stepped structure to cover the adhesive member 340 to prevent plasma from flowing into the adhesive member 340.

Referring to FIG. 13, in a portion from which plasma is exhausted, a protection ring 360b may be at an end portion of the adhesive member 340 to prevent the adhesive member 340 from being exposed to plasma.

Figure 14:
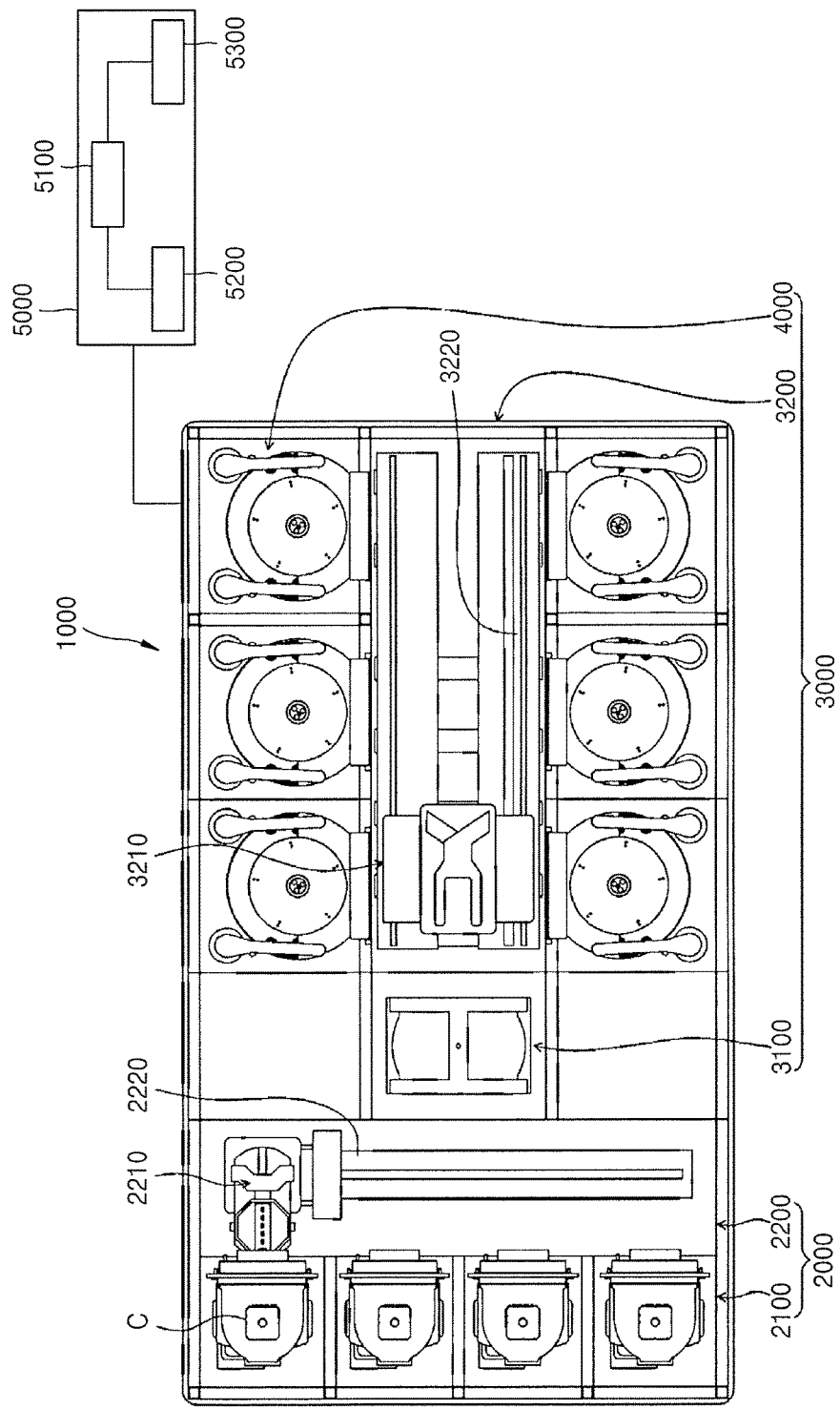
FIG. 14 illustrates an embodiment of a processing system.

FIG. 14 illustrates an embodiment of a processing system 1000 which includes a substrate processing apparatus. Referring to FIG. 14, the processing system 1000 includes an index module 2000 and a process module 3000. The index module 2000 receives a substrate from the outside and transfers the substrate to the process module 3000. The process module 3000 performs one or more operations on the substrate.

The index module 2000 includes at least one load port 2100 and at least one transfer frame 2200 to facilitate transfer of the substrate. A container C including a substrate may be placed in the load port 2100. At least one front opening unified pod (FOUP) may be used as the container C. The container C may be loaded into the load port 2100 from the outside or unloaded from the load port 2100 to the outside using an overhead transfer (OHT).

The transfer frame 2200 transfers the substrate between the container C in the load port 2100 and the process module 3000. The transfer frame 2200 may include an index robot 2210 and an index rail 2220. The index robot 2210 transfers the substrate while moving on the index rail 2220.

The process module 3000 performs one or more processes and may include a loadlock chamber 3100, a transfer chamber 3200, and a process chamber 4000. The loadlock chamber 3100 may include a first port connected to the index module 2000 and a second port connected to the transfer chamber 3200, and may provide a space in which the substrate temporarily stays. The loadlock chamber 3100 may have a buffer slot in which the substrate is placed. The loadlock chamber 3100 may include a plurality of buffer slots formed in a vertical direction. A plurality of substrates may be stacked in the plurality of buffer slots. The index robot 2210 may withdraw a substrate from the container C and place the substrate in the buffer slot.

A transfer robot 3210 of the transfer chamber 3200 may withdraw the substrate from the buffer slot and transfer the substrate to the process chamber 4000. A pressure control system may be connected to the loadlock chamber 3100. Thus, when the loadlock chamber 3100 receives a substrate from the index module 2000 or transfers the substrate to the process module 3000, the pressure control system may control a pressure and facilitate the transfer of the substrate.

The transfer chamber 3200 transfers the substrate between the loadlock chamber 3100 and the process chamber 4000, which are disposed around the transfer chamber 3200. The transfer chamber 3200 may include the transfer robot 3210 and a transfer rail 3220. The transfer robot 3210 may transfer the substrate while moving on the transfer rail 3220.

The process chamber 4000 may be a substrate processing apparatus according to one or more embodiments described herein and may be disposed around the transfer chamber 3200. The process chamber 4000 may receive a substrate from the transfer chamber 3200 and process the substrate.

The process module 3000 may include a plurality of process chambers 4000. The process chambers 4000 may be, for example, in a row at one side of the transfer chamber 3200 and/or another side thereof along a lengthwise direction of the transfer chamber 3200. Also, the process chambers 4000 may be stacked in a vertical direction. In another embodiment, the process chambers 400 may have a different arrangement taking into consideration, for example, factors, such as a footprint or process efficiency.

A system controller 5000 may be connected to the processing system 1000. The system controller 5000 may directly control the process chamber 4000 or control a computer (or controller) related to the process chamber 400 to control operations of the process system 1000. The system controller 5000 may collect data or perform a feedback operation to optimize performance of the processing system 1000.

The system controller 5000 may include a central processing unit (CPU) 5100, a memory 5200, and a support circuit 5300. The CPUS 100 may be one of general-use computers used for industrial setting. The support circuit 5300 may be normally connected to the CPU 5100 and include a cache, a clock circuit, an input/output circuit, and a power supply.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. A remote plasma generator, comprising:
   a body including a gas injection port, a plasma exhaust port, and a plasma generation pipe through which discharge gas or plasma flow;
   a driver, coupled to the body, to generate a magnetic field and plasma in the body;
   a protection tube, at an inner side of the plasma generation pipe, to protect the plasma generation pipe from plasma; and
   a protection layer at a portion of an inner side of the body except for the inner side of the plasma generation pipe.

2. The remote plasma generator as claimed in claim 1, wherein the protection layer includes a coating layer having plasma corrosion resistance.

3. The remote plasma generator as claimed in claim 1, wherein the protection tube includes yttrium oxide.

4. The remote plasma generator as claimed in claim 1, wherein a tolerance between the protection tube and the plasma generation pipe is about 0.1 mm to about 10 mm.

5. The remote plasma generator as claimed in claim 1, further comprising:
   an adhesive layer between the plasma generation pipe and the protection tube.

6. The remote plasma generator as claimed in claim 5, wherein the protection tube includes:
   a first bent portion extending from at least one of two end portions of the protection tube in a first direction and covering an end of the adhesive layer; and
   a second bent portion extending in a second direction crossing the first direction of the first bent portion.

7. The remote plasma generator as claimed in claim 5, wherein the protection tube includes:
   a first bent portion extending from at least one of two end portions of the protection tube in a first direction and covering an end of the adhesive layer; and
   a protection ring at an end of the first bent portion.

8. The remote plasma generator as claimed in claim 5, further comprising:
   a protection ring at least one of two end portions of the protection tube and covering an end of the adhesive layer, wherein the protection ring has an outer circumference with a stepped portion and extends in a direction crossing a main surface thereof.

9. The remote plasma generator as claimed in claim 5, wherein the adhesive layer includes a silicone adhesive.

10. The remote plasma generator as claimed in claim 1, further comprising:

a cooling channel formed in the body to circulate a cooling medium,
wherein the cooling channel has a first side connected to a cooling medium supply source and a second side connected to a cooling medium recovery device.

11. The remote plasma generator as claimed in claim 10, further comprising:
a temperature sensor to measure a temperature of the protection tube; and
a controller to receive a temperature signal from the temperature sensor and apply control signals to the cooling medium supply source and the cooling medium recovery device.

12. A remote plasma generator, comprising:
a body including a gas injection port and a plasma exhaust port;
a driver electrode, fixed to the body, to receive an alternating-current (AC) voltage and to generate plasma in the body;
a ground electrode fixed to the body and interposed between the driver electrode and the plasma exhaust port;
a protection layer to protect an inner side of the body from plasma; and
an adhesive layer between the body and the protection layer.

13. The remote plasma generator as claimed in claim 12, wherein the protection layer includes yttrium oxide.

14. An apparatus for a plasma generator, comprising:
a pipe to transfer gas or plasma; and
a protection layer on an inner surface the pipe,
wherein the protection layer separates the inner surface of the pipe from the gas or plasma and includes:
a first portion extending in a first direction substantially parallel to the inner surface of the pipe,
a second portion crossing the first direction, the second portion overlapping an end of the pipe and an end of a body adjacent to the end of the pipe, and
a third portion contacting the second portion of the protection layer, wherein the third portion extends from the end of the second portion of the protection layer in the first direction and wherein the third portion includes a ring contacting the second portion of the protection layer, the protection layer including a material resistant to corrosion from the gas or plasma.

15. The apparatus as claimed in claim 14, wherein the material includes yttrium oxide.

16. The apparatus as claimed in claim 14, wherein the third portion is integrally formed with the second portion.

* * * * *